United States Patent
Kanda et al.

(10) Patent No.: US 7,053,493 B2
(45) Date of Patent: May 30, 2006

(54) SEMICONDUCTOR DEVICE HAVING STIFFENER

(75) Inventors: Takashi Kanda, Kawasaki (JP); Kenji Fukuzono, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/992,651

(22) Filed: Nov. 22, 2004

(65) Prior Publication Data
US 2006/0043548 A1    Mar. 2, 2006

(30) Foreign Application Priority Data
Aug. 27, 2004  (JP)  .............................. 2004-248221

(51) Int. Cl.
*H01L 23/48*  (2006.01)
*H01L 23/52*  (2006.01)

(52) U.S. Cl. .................. 257/783; 257/703; 257/705; 257/706; 257/707; 257/711; 257/712; 257/713; 257/720; 257/E23.514

(58) Field of Classification Search ............ 257/783, 257/700–703, 705–707, 711–713, 720, 722, 257/753, E23.16, E23.514
See application file for complete search history.

(56) References Cited

U.S. PATENT DOCUMENTS

| | | | |
|---|---|---|---|
| 4,876,588 A | * | 10/1989 | Miyamoto .................. 257/706 |
| 4,901,137 A | * | 2/1990 | Sato et al. .................. 257/712 |
| 4,965,660 A | * | 10/1990 | Ogihara et al. ............. 257/717 |
| 5,552,637 A | * | 9/1996 | Yamagata .................. 257/717 |
| 5,886,399 A | | 3/1999 | Ohsawa et al. |
| 6,194,782 B1 | * | 2/2001 | Katchmar ................... 257/738 |
| 6,281,592 B1 | | 8/2001 | Murayama |
| 2005/0109534 A1 | * | 5/2005 | Chengalva et al. ......... 174/256 |

FOREIGN PATENT DOCUMENTS

| | | |
|---|---|---|
| JP | 6-4579 | 4/1989 |
| JP | 3-295263 | 12/1991 |
| JP | 6-204654 | 7/1994 |
| JP | 8-153938 | 6/1996 |
| JP | 9-82839 | 3/1997 |
| JP | 11-260953 | 9/1999 |
| JP | 2000-174176 | 6/2000 |
| JP | 2001-15561 | 1/2001 |
| JP | 2001-101375 | 4/2001 |
| JP | 2002-231769 | 8/2002 |
| JP | 2002-252301 | 9/2002 |

* cited by examiner

*Primary Examiner*—Jasmine Clark
(74) *Attorney, Agent, or Firm*—Armstrong, Kratz, Quintos, Hanson & Brooks, LLP

(57) ABSTRACT

A semiconductor device including a substrate, a semiconductor element mounted on the substrate and a stiffener attached via an adhesive to a surface of the substrate opposite a surface thereof on which the semiconductor element is mounted. The adhesive has a coefficient of thermal expansion smaller than that of the substrate and that of the stiffener, and the modulus of longitudinal elasticity of the adhesive is equal to or larger than 10 GPa. Otherwise, the adhesive has a coefficient of thermal expansion larger than that of the substrate and that of the stiffener, and the modulus of longitudinal elasticity of the adhesive is equal to or smaller than 10 GPa. The height of the stiffener is less than that of the external terminals.

5 Claims, 5 Drawing Sheets

SEMICONDUCTOR DEVICE HAVING STIFFENER

BACKGROUND OF THE INVENTION

1. Field of the Invention

The present invention relates to a semiconductor device provided with a stiffener.

2. Description of the Related Art

In a semiconductor device having a semiconductor element mounted on a substrate, a problem arises in that a warp may occur in the substrate and in the semiconductor element as a result of a difference between the coefficient of thermal expansion of the semiconductor element and that of the substrate. Accordingly, there have been proposals wherein a stiffener (a reinforcement member) is attached to the surface of the substrate opposite to that mounting the semiconductor element thereon to prevent the substrate and the semiconductor element from warping (for example, see Japanese Unexamined Patent Publication No. 3-295263, No. 6-204656, Japanese Unexamined Patent Publication No. 6-4579, No. 8-153938, No. 6-82839, No. 11-260953, No. 2000-174176, No. 2001-101375, No. 2001-15561, No. 2002-231769, and No. 2002-252301).

Because the rigidity of the substrate increases if a metallic stiffener is attached to the substrate, the substrate is resistant against the bending to minimize the warp of the substrate and of the semiconductor element. In this case, if the coefficient of thermal expansion of the stiffener is made to be the same level as that of the substrate, the warp of the substrate and the semiconductor element can be even further reduced. However, because the warp of the substrate and that of the semiconductor element are not completely eliminated, there is still a requirement for further reducing the warp of the substrate and of the semiconductor element.

SUMMARY OF THE INVENTION

An object of the present invention is to provide a semiconductor device capable of further reducing the warp of the substrate and that of the semiconductor element.

In one aspect of the invention, a semiconductor device, according to the present invention, comprises a substrate, a semiconductor element mounted on the substrate and a stiffener attached via an adhesive to a surface of the substrate opposite a surface thereof on which the semiconductor element is mounted, wherein the coefficient of thermal expansion of the adhesive is smaller than that of the substrate and that of the stiffener and the modulus of longitudinal elasticity of the adhesive is equal to or larger than 10 Gpa.

In another aspect of the invention, a semiconductor device, according to the present invention, comprises a substrate, a semiconductor element mounted on the substrate and a stiffener attached via an adhesive to a surface of the substrate opposite a surface thereof on which the semiconductor element is mounted, wherein the coefficient of thermal expansion of the adhesive is larger than that of the substrate and that of the stiffener, and the modulus of longitudinal elasticity of the adhesive is equal to or smaller than 10 Gpa.

In a further aspect of the invention, a semiconductor device, according to the present invention, comprises a substrate, a semiconductor element mounted on the substrate and a stiffener attached via an adhesive to a surface of the substrate opposite a surface thereof on which the semiconductor elememt is mounted, wherein the stiffener is a frame-like member having an outer contour generally identical to that of the semiconductor element, and external terminals are provided around the stiffener, a height of the stiffener being smaller than that of the external terminals.

As a result, the inventors of the present invention have studied the warp of the substrate and the warp of the semiconductor element in the semiconductor device provided with the stiffener, and it has been found that the warp of the substrate and the warp of the semiconductor element can be avoided by suitably selecting not only the characteristics of the stiffener but also the characteristics of the adhesive used for fixing the stiffener to the substrate. Accordingly, it is possible to further minimize the warp of the substrate and the warp of the semiconductor element if the characteristics of the material forming the respective members are properly selected to satisfy the above-mentioned relationship of between the coefficient of thermal expansion of the substrate and that of the stiffener and that of the adhesive, and the modulus of longitudinal elasticity of the adhesive.

Also, in the case of the semiconductor device having external terminals provided on the substrate around the stiffener, if a height of the stiffener is less than that of the external terminals, the external terminals formed as solder balls are assuredly bonded to the terminals of the printed circuit board and the stiffener is brought into contact with the surface of the printed circuit board, whereby the stiffener exhibits a stand-off function to properly connect the substrate to the printed circuit board. Thus, the warp of the substrate and the warp of the semiconductor element is further minimized.

DESCRIPTION OF THE PREFERRED EMBODIMENTS

Figure 1:
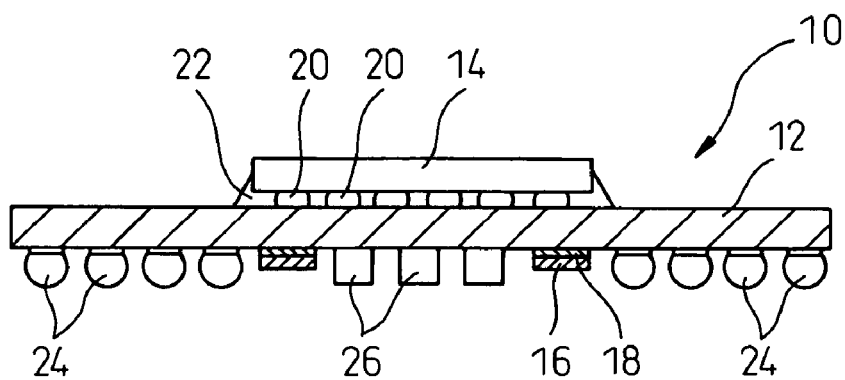
FIG. 1 is a cross-sectional view of a semiconductor device according to the present invention.
Figure 2:
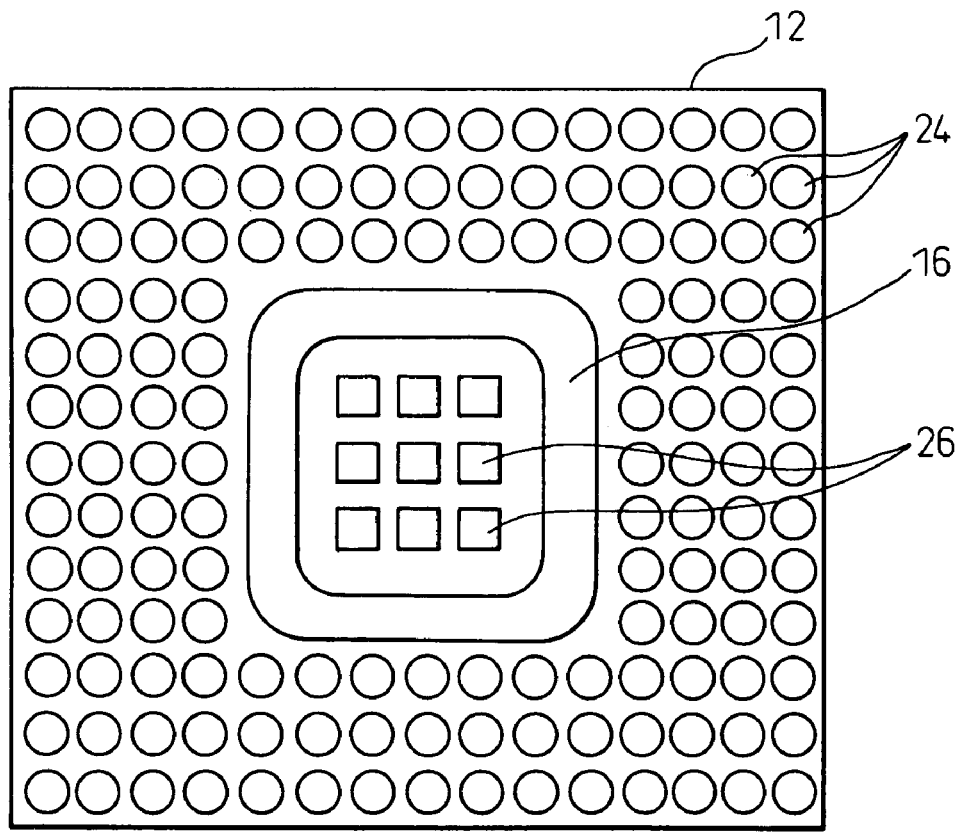
FIG. 2 is a bottom view of the semiconductor device shown in FIG. 1.

The preferred embodiments of the present invention will now be described with reference to the attached drawings. FIG. 1 is a cross-sectional view of the semiconductor device according to the present invention and FIG. 2 is a bottom view of the semiconductor device shown in FIG. 1. In FIGS.

1 and 2, the semiconductor device 10 includes a substrate 12, a semiconductor element (an LSI chip) 14 mounted on the substrate 12, and a stiffener 16 attached via an adhesive 18 to a surface of the substrate 12 opposite that carrying the semiconductor element 14 thereon. Bumps (solder balls) 20 are provided on electrode pads of the semiconductor element 14, and joined to corresponding electrode pads of the substrate 12 by flip-chip bonding. An under-fill material 22 is filled around the bumps 20 in a gap between the semiconductor element 14 and the substrate 12.

The stiffener 16 is a frame-like member having an outer contour generally identical to that of the semiconductor element. The stiffener 16 is attached to the substrate 12 so that the center of the stiffener 16 coincides with the center of the semiconductor element 14. Further, external terminals 24 comprising solder balls are provided on the substrate 12 around the stiffener 16, and electric parts 26 such as capacitors or others are provided on the substrate 12 within the stiffener 16. Circuits are formed in the substrate 12 and the external terminals 24 are connected to electrode pads on the bumps 20 of the substrate 12 via the circuit. The external terminals 24 are arranged in a BGA.

The height of the stiffener 16 is less than the height of the external terminals 24. For example, the thickness of the stiffener 16 is 0.4 mm, and the diameter of the solder ball forming the external terminals 24 is 0.6 mm.

The stiffener 16 is made of a metallic material having coefficient of thermal expansion approximately the same as that of the substrate 16. For example, the stiffener 16 is made of stainless steel (SUS 304) having a coefficient of thermal expansion of 17.3 ppm/°C. and a modulus of longitudinal elasticity of 5 GPa. The stiffener 16 may be made of other metallic material such as copper. The coefficient of thermal expansion of copper is 17 ppm/°C. The substrate 12 is made of organic resin such as BT resin and coefficient of thermal expansion of the substrate 12 containing circuit materials is 17 ppm/°C.

The adhesive 18 is made of a material having a modulus of longitudinal elasticity determined in accordance with the relationship between the coefficient of thermal expansion of the adhesive 18, and those of the substrate 12 and the stiffener 16. That is, (a) when the coefficient of thermal expansion of the adhesive 18 is smaller than those of the substrate 12 and the stiffener 16, the modulus of longitudinal elasticity of the adhesive is equal to or larger than 10 GPa, and (b) when the coefficient of thermal expansion of the adhesive 18 is larger than those of the substrate 12 and the stiffener 16, the modulus of longitudinal elasticity of the adhesive is equal to or smaller than 10 Gpa.

Figure 3:
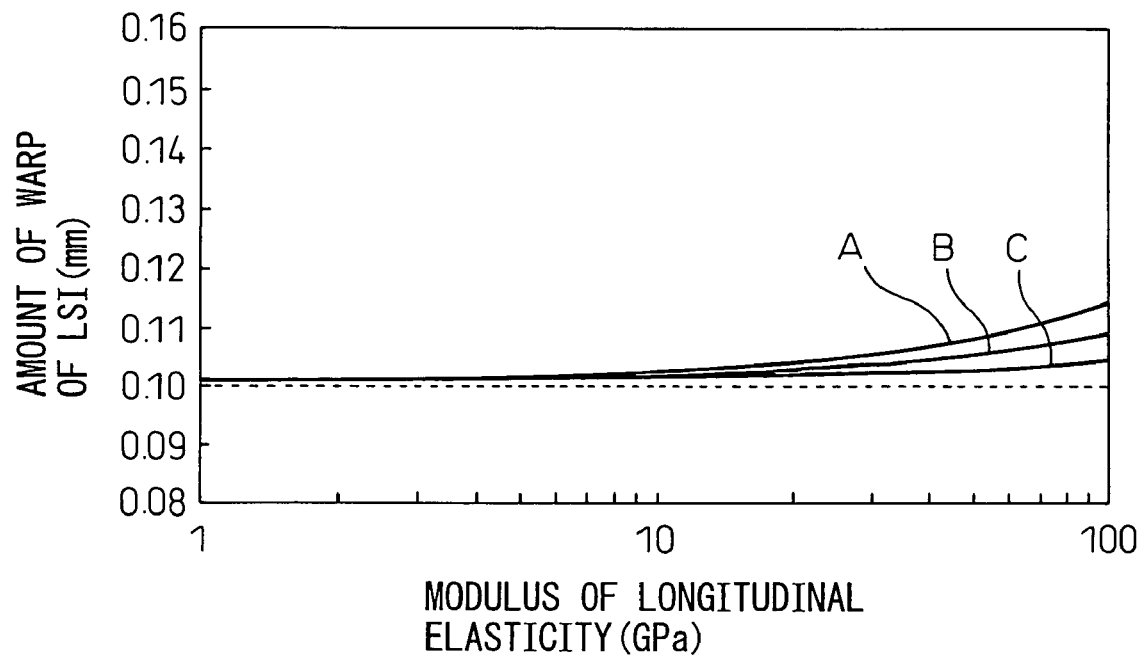
FIG. 3 is a view illustrating the warp of the semiconductor element relative to the modulus of longitudinal elasticity of the adhesive when the stiffener is made of stainless steel.

FIG. 3 is a view illustrating the warp of the semiconductor element (LSI chip) 14 relative to the modulus of longitudinal elasticity of the adhesive 18 when the stiffener 16 is made of stainless steel. The amount of warp is represented in mm when the semiconductor element 14 is of 20 mm square (i.e., mm/20 mm square). The curve A is obtained when the coefficient of thermal expansion of the adhesive 18 is 30 ppm/°C.; the curve B is obtained when the coefficient of thermal expansion of the adhesive 18 is 25 ppm/°C.; and the curve C is obtained when the coefficient of thermal expansion of the adhesive 18 is 20 ppm/°C. These values (30, 25 and 20) of the coefficient of thermal expansion are larger than the coefficient of thermal expansion (17) of the substrate 12 and that (17.3) of the stiffener 16. In this case, if the modulus of longitudinal elasticity is equal to or smaller than 10 GPa, the amount of warp of the substrate 12 becomes smaller. If the modulus of longitudinal elasticity is equal to or larger than 10 GPa, the amount of warp of the substrate 12 gradually increases. For example, if the coefficient of thermal expansion of the adhesive 18 is 40 ppm/°C., the amount of warp of the substrate 12 becomes larger than the values on the curve A in FIG. 3 in the range of modulus of longitudinal elasticity of the adhesive 18 larger than 10 GPa, but the amount of warp of the substrate 12 is approximately the same as the values on the curve A of FIG. 3 in the range of modulus of longitudinal elasticity of the adhesive 18 is equal to or smaller than 10 GPa. Accordingly, it is possible to use the adhesive 18 having a coefficient of thermal expansion of 40 ppm/°C.

Figure 4:
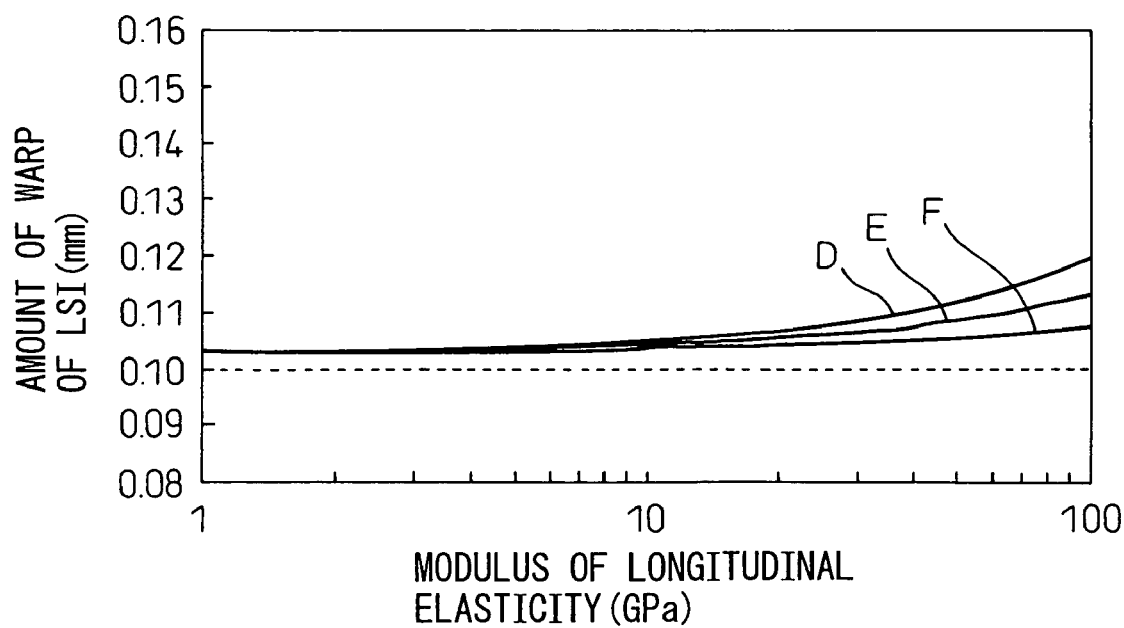
FIG. 4 is a view illustrating the warp of the semiconductor element relative to the modulus of longitudinal elasticity of the adhesive when the stiffener is made of copper.

FIG. 4 is a view illustrating the warp of the semiconductor element (LSI chip) 14 relative to the modulus of longitudinal elasticity of the adhesive 18 when the stiffener 16 is made of copper. The curve D is obtained when the coefficient of thermal expansion of the adhesive 18 is 30 ppm/°C.; the curve E is obtained when the coefficient of thermal expansion of the adhesive 18 is 25 ppm/°C.; and the curve F is obtained when the coefficient of thermal expansion of the adhesive 18 is 20ppm/°C. These values (30, 25 and 20) of the coefficient of thermal expansion are larger than the coefficient of thermal expansion (17) of the substrate 12 and that (17) of the stiffener 16. In this case, if the modulus of longitudinal elasticity of the adhesive 18 is equal to or smaller than 10 GPa, the amount of warp of the substrate 12 is small. Contrarily,if the modulus of longitudinal elasticity is larger than 10 GPa, the amount of the substrate 12 gradually increases.

Figure 5:
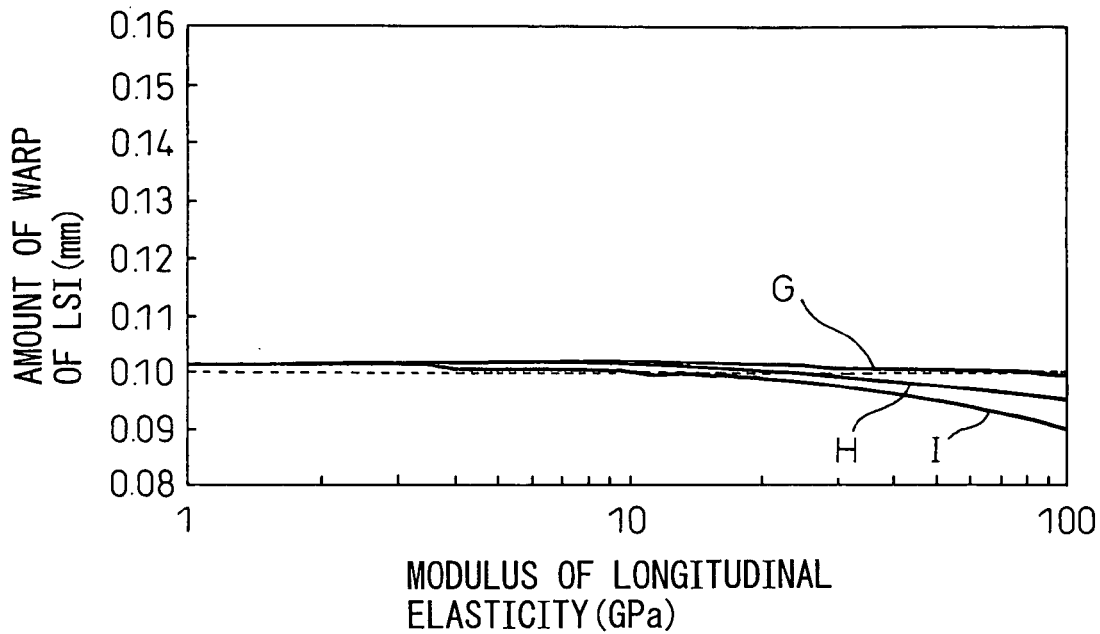
FIG. 5 is a view illustrating the warp of the semiconductor element relative to the modulus of longitudinal elasticity of the adhesive when the stiffener is made of stainless steel.

FIG. 5 is a view illustrating the warp of the semiconductor element (LSI chip) 14 relative to the modulus of longitudinal elasticity of the adhesive 18 when the stiffener 16 is made of stainless steel. The curve G is obtained when the coefficient of thermal expansion of the adhesive 18 is 15ppm/°C.; the curve H is obtained when the coefficient of thermal expansion of the adhesive 18 is 10ppm/°C.; and the curve I is obtained when the coefficient of thermal expansion of the adhesive 18 is 5 ppm/°C. These values (15,10 and 5) of the coefficient of thermal expansion are larger than the coefficient of thermal expansion (7) of the substrate 12(17) and that (17.3) of the stiffener 16. In this case, if the modulus of longitudinal elasticity of the adhesive 18 is equal to or larger than 10 GPa, the amount of warp of the substrate 12 becomes considerably small.

Figure 6:
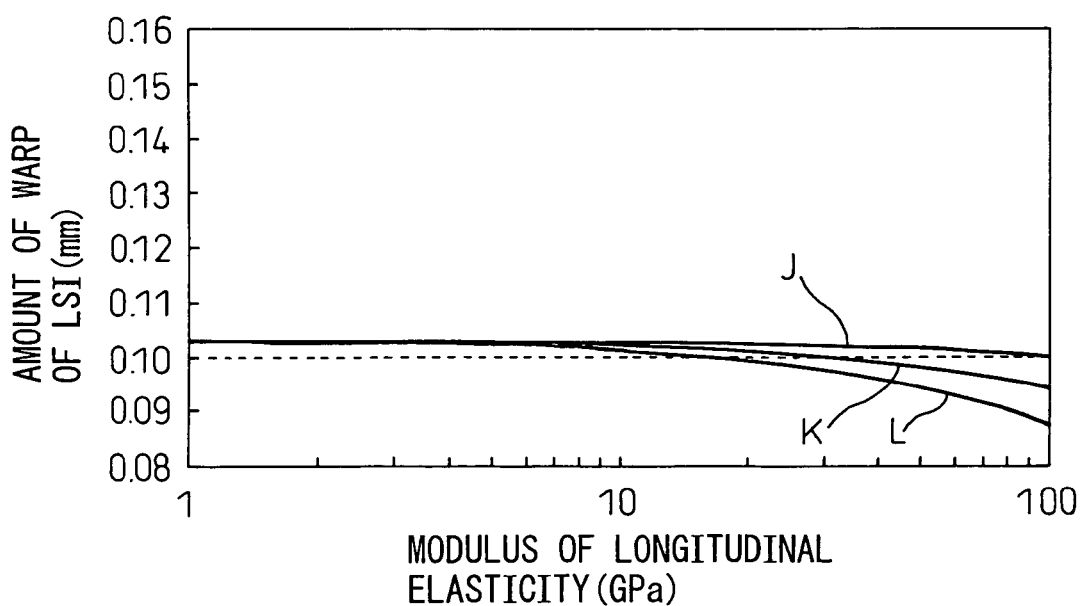
FIG. 6 is a view illustrating the warp of the semiconductor element relative to the modulus of longitudinal elasticity of the adhesive when the stiffener is made of copper.

FIG. 6 is a view illustrating the warp of the semiconductor element (LSI chip) 14 relative to the modulus of longitudinal elasticity of the adhesive 18 when the stiffener 16 is made of copper. The curve J is obtained when the coefficient of thermal expansion of the adhesive 18 is 15 ppm/°C.; the curve K is obtained when the coefficient of thermal expansion of the adhesive 18 is 10 ppm/°C.; and the curve L is obtained when the coefficient of thermal expansion of the adhesive 18 is 5ppm/°C. These values (15, 10 and 5) of the coefficient of thermal expansion are larger than the coefficient of thermal expansion (17) of the substrate 12 and that (17.3) of the stiffener 16. In this case, if the modulus of longitudinal elasticity of the adhesive 18 is equal to or larger than 10 GPa, the amount of warp of the substrate 12 becomes considerably small.

The adhesive 18 is a thermosetting resin formed of an adhesive resin material (such as epoxy resin) containing fillers and is provided as an adhesive sheet. The coefficient of thermal expansion and the modulus of longitudinal elasticity of the adhesive 18 are measured after the adhesive sheet is heated and cured. The adhesive 18 has a thickness in the range from 50 to 100mm, but the thickness of the adhesive 18 has no influence on the amount of warp of the substrate 12.

The above-mention result is obtained when the stiffener 16 and the substrate 12 have substantially the same coefficients of thermal expansion. If the coefficient of thermal expansion of the stiffener 16 is considerably different from that of the substrate 12, the result may be different. For example, when the stiffener 16 is made of aluminum (having a coefficient of thermal expansion of approximately 23), the amount of warp of the substrate 12 is approximately 0.14, which is considerably larger than the values shown in Figs. 3 to 8 and is favorable.

Figure 7:
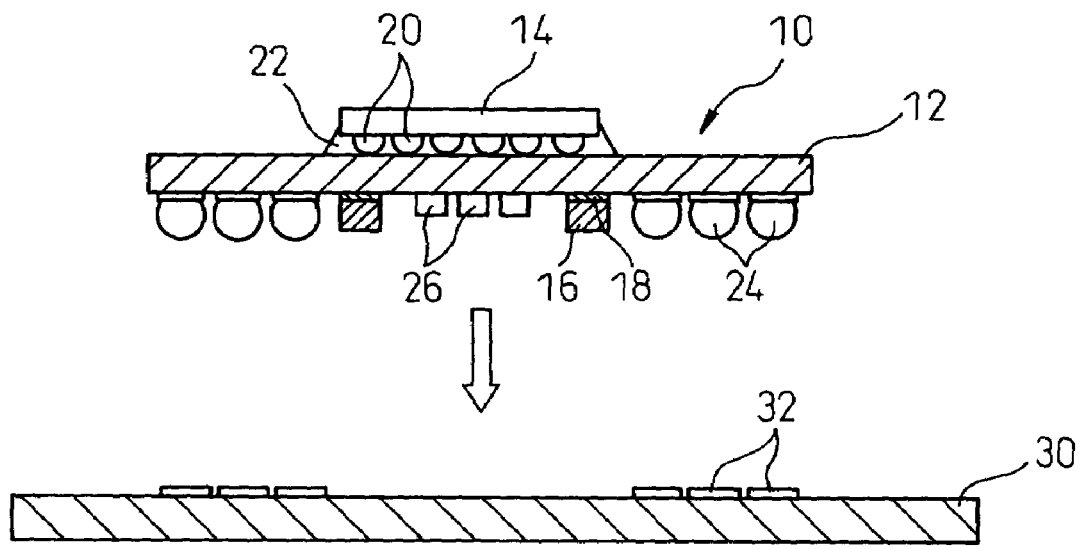
FIG. 7 is a view illustrating an example in which the semiconductor device shown in FIG. 1 is being mounted on a printed circuit board.
Figure 8:
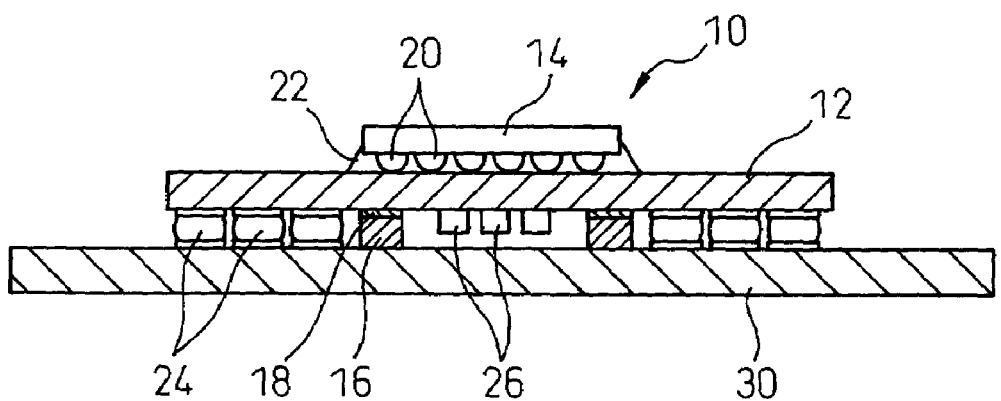
FIG. 8 is a view illustrating the semiconductor device of FIG. 7 after it is mounted.

FIG. 7 is a view illustrating an example in which the semiconductor device 10 shown in Fig. 1 is being mounted on a printed circuit board (a mother board) 30. FIG. 8 is a view illustrating the semiconductor device of FIG. 7 after it is mounted. The printed circuit board 30 has terminals 32 corresponding to the external terminals 24 of the semiconductor device 10. As described above, the semiconductor device 10 includes the substrate 12, the semiconductor element 14 mounted on the substrate 12, and the stiffener 16 attached via the adhesive 18 to a surface of the substrate 12 opposite that carrying the semiconductor element 14. The stiffener 16 is a frame-like member having an outer contour generally identical to that of the semiconductor element 14, and the external terminals 24 are provided on the substrate 12 around the stiffener 16. A height of the stiffener 16 is smaller than that of the external terminal 24. After the semiconductor 10 is mounted on the printed circuit board 30, the stiffener 16 is in contact with the surface of the printed circuit board 30.

In the case of the semiconductor devise 10 having the external terminals 24 provided on the substrate 12 around the stiffener 16, the external 24s, for example, formed as solder balls are securely bonded to the terminal 32 of the printed circuit board 30 and the stiffener 16 is in contact with the surface of the 24, so that the stiffener 16 exhibits a stand-off function to well couple the substrate 12 to the printed circuit board 30, whereby the warp of the substrate 12 and the semiconductor element 14 is further minimized.

Figure 9:
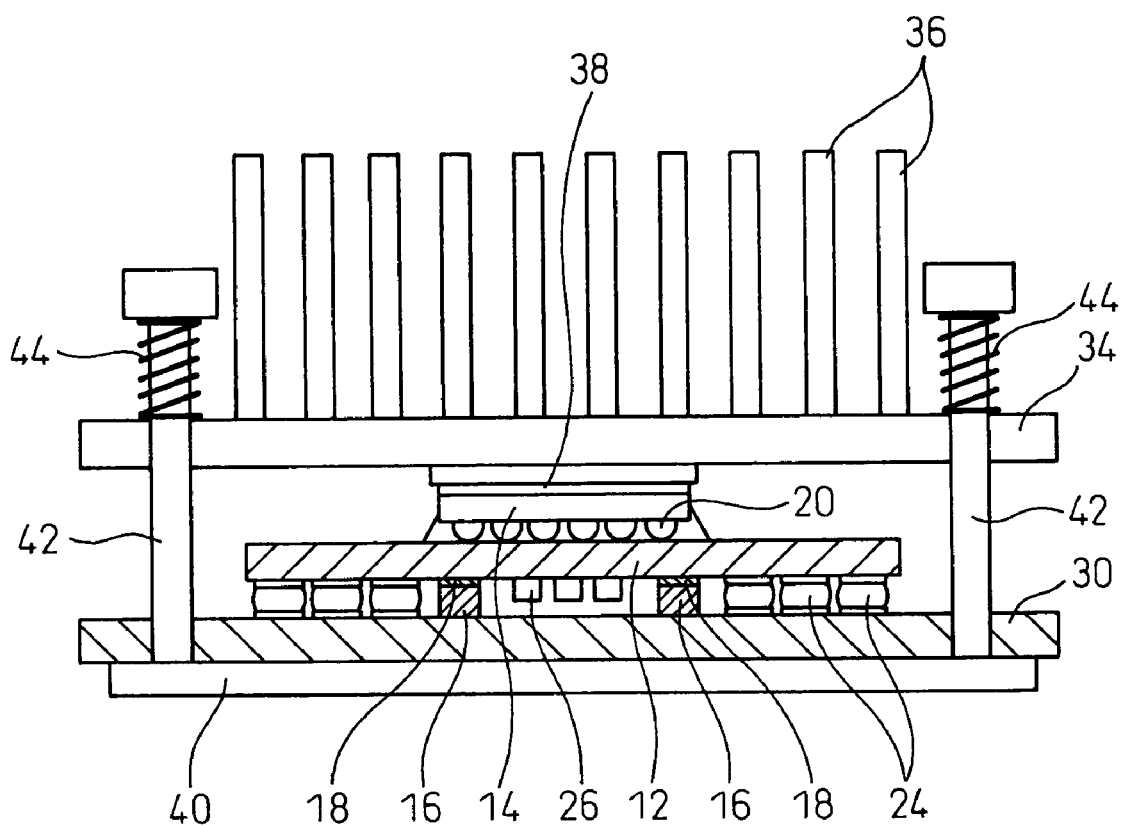
FIG. 9 is a view illustrating an example of the semiconductor device shown in FIG. 7 to which a heat sink is attached.

FIG. 9 is a view illustrating an example of the semiconductor device 10 shown in FIG. 7 to which a heat sink (cooling member) 34 is attached. The heat sink 34 has fins 36, and is coupled to the semiconductor element 14 via a heat conductive member 38. The heat conductive member 38 is formed of a good heat conductive material such as thermal compound or thermal sheet. The heat sink 34 is pressed onto the semiconductor element 14 via the heat conductive member 38 and fixed to the printed circuit board 30. In the example shown in FIG. 9, the printed circuit board 30 is supported by a supporting plate 40, and screws 42 are threaded in the supporting plate 40 through holes provided in the heat sink 34 and the printed circuit board 30. A coil spring 44 is located between the head of each screw 42 and the heat sink 34 to press the heat sink 34 onto the semiconductor element 14 due to an elastic force of the springs 44.

In this way, by pressing the heat sink 34 onto the semiconductor element 14 by the elastic force of the springs 44 to bring the stiffener 16 into contract with the surface of the printed circuit board 30, the heat conductive member 38 is maintained at a constant thickness under the predetermined pressure, and is capable of transferring heat from the semiconductor element 14 to the heat sink 34 while stabilizing the heat resistance of the heat conductive member 38. Thus, the stiffener 16 exhibits not only the above-mentioned warp reduction function and the stand-off function but also the stand-off function for avoiding an excessive force applied to a portion between the external terminal 24 and the terminal 32 due to the elastic force of the springs 44. Accordingly, a stress generated at the joint between the externals 24 arranged as BGA and the terminals of the printed circuit board 30 and in the semiconductor element 14 is mitigated to provide a semiconductor device high in reliability.

As describe above, according to the present invention, it is possible to obtain a highly reliable semiconductor device in which the warp of the semiconductor element is small.

The invention claimed is:

1. A semiconductor device comprising a substrate, a semiconductor element mounted on the substrate and a stiffener attached via an adhesive to a surface of the substrate opposite a surface thereof on which the semiconductor element is mounted, wherein the coefficient of thermal expansion of the adhesive is smaller than that of the substrate and that of the stiffener, and the modulus of longitudinal elasticity of the adhesive is equal to or larger than 10 GPa.

2. A semiconductor device comprising a substrate, a semiconductor element mounted on the substrate and a stiffener attached via an adhesive to a surface of the substrate opposite a surface thereof on which the semiconductor element is mounted, wherein the coefficient of thermal expansion of the adhesive is larger than that of the substrate and that of the stiffener, and the modulus of longitudinal elasticity of the adhesive is equal to or smaller than 10 GPa.

3. A semiconductor device comprising a substrate, a semiconductor element mounted on the substrate and a stiffener attached via an adhesive to a surface of the substrate opposite a surface thereof on which the semiconductor element is mounted, wherein the stiffener is a frame-like member having an outer contour generally identical to that of the semiconductor element, and external terminals are provided around the stiffener, the height of the stiffener being smaller than that of the external terminals.

4. A semiconductor device as defined by claim 3, further comprising a printed circuit board having terminals to be connected to the external terminals, wherein the stiffener is brought in contact with a surface of the printed circuit board.

5. A semiconductor device as defined by claim 4, wherein a cooling member is coupled to the semiconductor element via a heat-conductive member, and is fixed to the printed circuit board.

* * * * *